(12) United States Patent
Lee

(10) Patent No.: US 7,768,833 B2
(45) Date of Patent: Aug. 3, 2010

(54) METHOD OF PROGRAMMING NON-VOLATILE MEMORY DEVICE

(75) Inventor: Hee Youl Lee, Icheon-si (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 173 days.

(21) Appl. No.: 12/147,109

(22) Filed: Jun. 26, 2008

(65) Prior Publication Data

US 2009/0129170 A1 May 21, 2009

(30) Foreign Application Priority Data

Nov. 21, 2007 (KR) .................. 10-2007-0119039

(51) Int. Cl.
*G11C 16/04* (2006.01)
(52) U.S. Cl. .................. 365/185.17; 365/185.25
(58) Field of Classification Search ............ 365/185.17, 365/185.25, 185.03, 185.18
See application file for complete search history.

(56) References Cited

U.S. PATENT DOCUMENTS

2007/0140013 A1* 6/2007 Kwon et al. ........... 365/185.17
2008/0159004 A1* 7/2008 Hemink et al. ......... 365/185.25
2009/0086542 A1* 4/2009 Lee et al. .............. 365/185.17

FOREIGN PATENT DOCUMENTS

KR 10-2002-0039744 5/2002

OTHER PUBLICATIONS

Office Action dated Sep. 30, 2009, for Korean application No. 10-2007-0119039.

* cited by examiner

*Primary Examiner*—Vu A Le
(74) *Attorney, Agent, or Firm*—Lowe Hauptman Ham & Berner LLP

(57) ABSTRACT

A method of programming a non-volatile memory device includes, a bit line, to which a program-inhibited cell is connected, being precharged. After precharging the bit line, a program voltage is applied to a first word line selected for program. When a memory cell connected to a second word line, which is adjacent to the first word line in a direction of a drain select line, is a cell to be programmed, a first pass voltage is applied to the second word line and a second pass voltage is applied to the remaining word lines other than the first and second word lines.

16 Claims, 2 Drawing Sheets

METHOD OF PROGRAMMING NON-VOLATILE MEMORY DEVICE

CROSS-REFERENCES TO RELATED APPLICATION

The present application claims priority to Korean patent application number 10-2007-0119039, filed on Nov. 21, 2007, which is incorporated by reference in its entirety.

BACKGROUND OF THE INVENTION

The present invention relates to an operation of a non-volatile memory device. More particularly, the present invention relates to a method of operating a flash memory device in which bit lines to which an inhibited cell is connected are boosted sufficiently.

Semiconductor memory devices can be classified into volatile memory devices that lose data as time goes by, such as dynamic random access memory (DRAM) and static random access memory (SRAM), and non-volatile memory devices that can retain its data.

There is an increasing demand for flash memory to/from which data can be input/output electrically. Flash memory is a device in which the data can be electrically erased at high speed in a state where circuits are not removed from a board. Flash memory has a simple memory cell structure and is therefore advantageous in that the production prime cost per unit memory is cheap. Flash memory is also advantageous in that it does not require a refresh function for retaining data.

Flash memory is largely classified into a NOR type and a NAND type. NOR type flash memory requires one contact per two cells and is disadvantageous in high integration, but is advantageous in high speed due to a high cell current. NAND type flash memory is disadvantageous in high speed due to a low cell current, but is advantageous in high integration since a plurality of contacts shares one contact. Accordingly, the NAND flash memory devices have been in the spotlight as the next-generation memory devices in the use of digital devices, such as MP3, digital camera, mobile and auxiliary storage devices, increases rapidly.

FIG. 1 is a view illustrating the unit string of a NAND flash memory device.

Referring to FIG. 1, the unit string of the NAND flash memory device includes a gate in which a floating gate 110 and a control gate 120 are stacked between a drain select transistor DST for selecting a unit string and a source select transistor SST for selecting ground. Memory cells MC0 through MC31, having the gate, are connected in series, thus constituting one string.

The string is connected to a bit line BL (not shown). A plurality of structures in each of which the string and the bit line are connected is connected in parallel to thereby form one block. The blocks are symmetrically arranged on the basis of a bit line contact. The select transistors DST (not shown), SST (not shown) and the memory cells MC0 through MC31 are arranged in a matrix form of rows and columns. The gates of the drain select transistor DST and the source select transistor SST arranged in the same column are connected to a drain select line DSL and a source select line SSL, respectively. The gates of the memory cells MC0 through MC31 arranged in the same column are connected to a plurality of corresponding word lines WL0 through WL31. Further, the drain of the drain select transistor DST is connected to the bit line BL and to the source of the source select transistor SST is connected a common source line CSL (not shown).

A program operation of the NAND flash memory device as constructed above is described below.

Programming is performed by injecting electrons of a channel area into a floating gate by Fowler-Nordheim (F-N) tunneling, which is generated due to a high voltage difference, between a channel area and a control gate of a selected memory cell, as 0V is applied to a selected bit line and a program voltage Vpgm is applied to a selected word line.

However, the program voltage Vpgm is applied not only to a selected memory cell, but also to unselected memory cells that are arranged along the same word line, so that the unselected memory cells connected to the same word line are also programmed. This phenomenon is called program disturbance. In order to prevent such program disturbance, after the source of the drain select transistor DST of a string, including unselected memory cells connected to a selected word line and unselected bit lines, is precharged to a level Vcc–Vth (Vcc is power source voltage and Vth is the threshold voltage of the drain select transistor), the selected word line is applied with the program voltage Vpgm and unselected word lines are applied with a pass voltage Vpass, so that a channel voltage Vch of the memory cells belonging to the same string, is boosted.

In the method of boosting the channel voltage in order to inhibit unselected memory cells from being programmed, the degree of boosting can vary depending on how program cells are arranged around a selected word line. Further, disturbance can occur since boosting is insufficient.

BRIEF SUMMARY OF THE INVENTION

In essence, the present invention is directed to a method of programming a non-volatile memory device, which can realize channel boosting without the influence of programmed memory cells around a selected memory cell in a channel boosting method for program inhibition when a programming operation is performed on the non-volatile memory device.

A method of programming a non-volatile memory device according to an aspect of the present invention includes precharging a bit line to which a program-inhibited cell is connected, and after precharging the bit line, applying a program voltage to a first word line selected for program and, when a memory cell connected to a second word line, being adjacent to the first word line in the direction of a drain select line, is a cell to be programmed, applying a first pass voltage to the second word line and a second pass voltage to the remaining word lines other than the first and second word lines.

The method further includes, when the memory cell connected to the second word line is not to be programmed, applying the second pass voltage to the second word line.

The first pass voltage has a voltage level, which is lower than that of the program voltage, but higher than that of the second pass voltage.

In the program operation, a source select transistor connected to a source select line is turned off.

A method of programming a non-volatile memory device according to another aspect of the present invention includes precharging a bit line to which a program-inhibited cell is connected, and after precharging the bit line, applying a program voltage to a first word line selected for program, and, when memory cells connected to second and third word lines adjacent to the selected word line are in a program state, applying a first pass voltage to each of the second and third word lines and a second pass voltage to the remaining word lines other than the first to third word lines.

The method further includes, when the memory cell connected to the second or third word line is not to be programmed, applying the second pass voltage to the second or third word line connected to the not-to-be-programmed memory cell.

The first pass voltage has a voltage level, which is lower than that of the program voltage, but higher than that of the second pass voltage.

In the program operation, a source select transistor connected to a source select line is turned off.

A method of programming a non-volatile memory device according to still another aspect of the present invention includes precharging a bit line to which a program-inhibited cell is connected, and after precharging the bit line, applying a program voltage to a first word line selected for program, and, when a memory cell connected to a second word line adjacent to the selected word line in the direction of a drain select line and a memory cell connected to a third word line adjacent to the selected word line in the direction of a source select line are in a program state, applying a first pass voltage to each of the second and third word lines, a third pass voltage to a fourth word line adjacent to the third word line in the direction of the drain select line, and a second pass voltage to the remaining word lines other than the first to fourth word lines.

The method further includes, when the memory cell connected to the second or third word line is not to be programmed, applying the second pass voltage to the second or third word line connected to the not-to-be-programmed memory cell.

The first pass voltage has a voltage level, which is lower than that of the program voltage, but higher than that of the second pass voltage, and the third pass voltage has a voltage level lower than that of the second pass voltage.

In the program operation, a source select transistor connected to a source select line is turned off.

DESCRIPTION OF SPECIFIC EMBODIMENTS

Now, specific embodiments according to the present invention will be described with reference to the accompanying drawings. However, the present invention is not limited to the disclosed embodiments, but may be implemented in various ways. The embodiments are provided to complete the disclosure of the present invention and to allow those having ordinary skill in the art to understand the scope of the present invention. The scope of present invention is defined by the claims.

Figure 1:
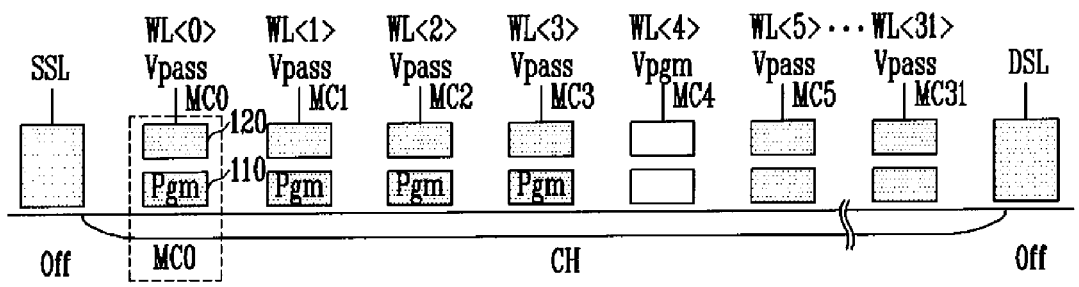
FIG. 1 is a view illustrating the unit string of a NAND flash memory device.
Figure 2:
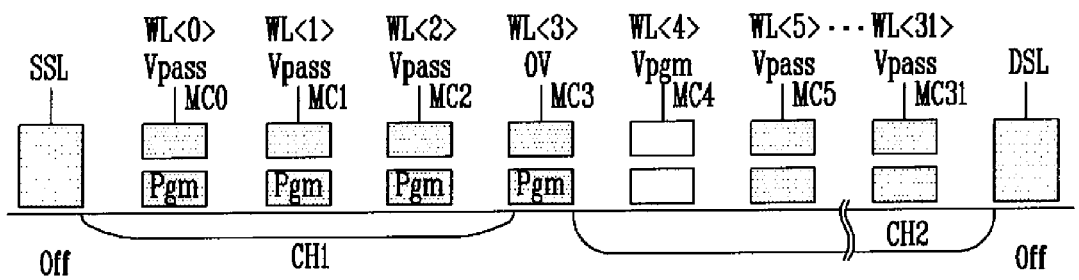
FIG. 2 is a view illustrating the application of voltages to word lines using an erase area self-boosting method of a program-prohibited cell string.

FIG. 2 is a view illustrating the application of voltages to word lines using an erase area self-boosting method of a program-prohibited cell string.

Referring to FIG. 2, a cell string includes memory cells connected in series between two transistors. Respective strings are connected to bit lines, respectively.

The two transistors connected to the string include a drain select transistor DST and a source select transistor SST.

Strings are arranged in a longitudinal direction. The bit lines are connected to the ends of the drain select transistors, respectively. Further, the gates of the memory cells are commonly connected in a traverse direction crossing the strings arranged in the longitudinal direction.

Further, the gates of the drain select transistors are commonly connected to a drain select line DSL and the gates of the source select transistors are commonly connected to a source select line SSL.

Word lines to which the memory cells are connected in a traverse direction include first to thirty-second word lines WL0 through WL31. The first to thirty-second word lines WL<0> through WL<31> are connected to gates of first to thirty-second memory cells MC0 through MC31, respectively.

Here, the first through fourth memory cells MC0 through MC3 are programmed and the fifth through thirty-second memory cells MC4 through MC31 are not programmed. Further, a memory cell on which program will be performed subsequently is a memory cell connected to the fifth word line WL<4>.

Since the cell string of FIG. 2 is a program-inhibited string, the bit lines are precharged when a program operation begins.

Further, the fifth word line WL<4> is applied with a high voltage, that is, a program voltage Vpgm, the first through third word lines WL<0> through WL<2> and the sixth through thirty-second word lines WL<5> through WL<31> are applied with a pass voltage Vpass, and the fourth word line WL<3> is applied with 0V.

A first channel CH1 is formed in the source select line SSL direction and a second channel CH2 is formed in the drain select line DSL direction, on the basis of the fourth memory cell MC3, so that the respective channels are boosted. Thus, the string can be program-inhibited. The method of performing program inhibition by applying 0V to the word line of a memory cell adjacent in the SSL direction in a memory cell to be programmed and applying the pass voltage to the remaining word lines of the memory cells in the same manner as an existing word line voltage, as described above, is called an erase area self-boosting (EASB) method.

Alternatively, the application of voltages to word lines for program inhibition of a cell string as shown in FIG. 2 can be performed as follows.

Figure 3:
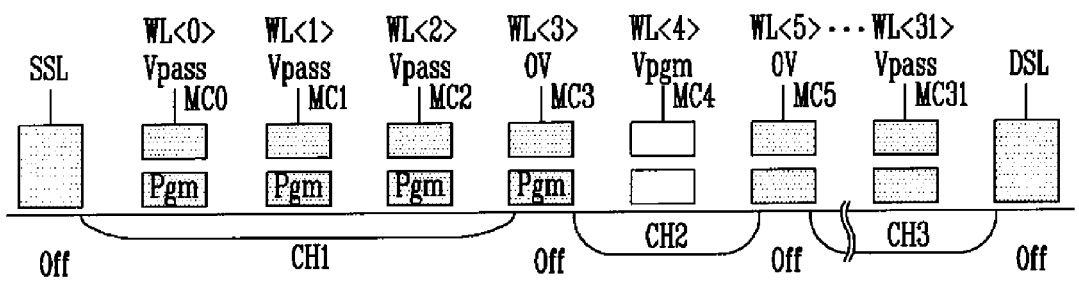
FIG. 3 is a view illustrating the application of voltages to word lines using a local self-boosting method of a program-prohibited cell string.

FIG. 3 is a view illustrating the application of voltages to word lines using a local self-boosting method of a program-prohibited cell string.

Referring to FIG. 3, when the program voltage Vpgm is applied to the fifth word line WL<4> in a state where memory cells are programmed as shown in FIG. 2, 0V is applied to the fourth word line WL<3> and the sixth word line WL<5> adjacent to the fifth word line WL<4> and the pass voltage Vpass is applied to the remaining word lines.

If the word line voltages are applied as described above, a first channel CH1 is formed between the source select line SSL and the fourth memory cell MC3, a second channel CH1 is formed between the fourth memory cell MC3 and the sixth memory cell MC5, and a third channel CH3 is formed between the sixth memory cell MC5 and the thirty-second memory cell MC31. The first through third channels CH1 through CH3 are boosted, so the cell string is program-inhibited.

The method of performing program inhibition by applying 0V to the front and rear word lines on the basis of a word line selected for program as described above is called a local self-boosting (LSB) method.

In FIGS. 2 and 3, in the case in which program is sequentially performed from the first word line WL<0> on the source elect line SSL side to the thirty-second word line WL<31> on the drain select line DSL side, all memory cells in the drain select line DSL direction of a memory cell to be programmed, are not programmed. Thus, there is no problem in program-inhibiting the memory cells.

However, if a program is performed according to various scheduling methods, there is a case in which front and rear word lines of a word line to be programmed are already programmed. In this case, the following problems may occur although the method of FIG. 2 or 3 is employed.

Figure 4:
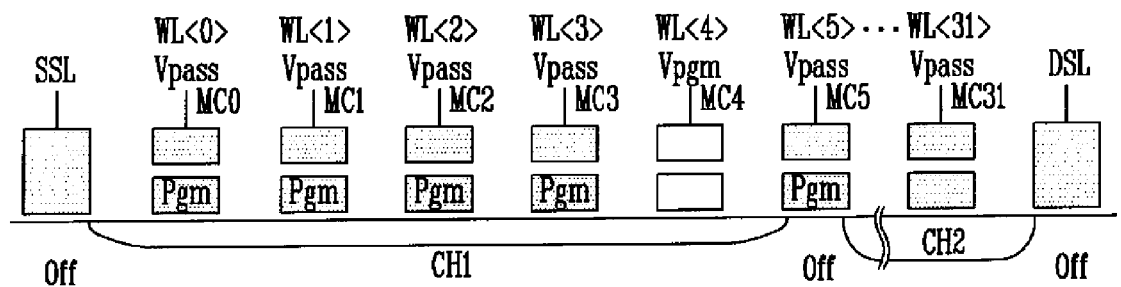
FIG. 4 is a view illustrating the application of voltages to word lines of a program-inhibited cell string.

FIG. 4 is a view illustrating the application of voltages to word lines of a program-inhibited cell string.

Referring to FIG. 4, a cell string includes first through thirty-second memory cells MC0 through MC31 and to gates of the memory cells are connected first to thirty-second word lines WL<0> to WL<31>.

In the case in which program on the first through fourth word lines WL<0> through WL<3> and the sixth word line WL<5> have been programmed and program on the fifth word line WL<4> is subsequently performed, a program voltage Vpgm is applied to the fifth word line WL<4> and a pass voltage Vpass is applied to the remaining word lines.

In the case in which the voltages are applied to the word lines as described above, if the source select line SSL and the drain select line DSL are turned on for channel boosting, voltages of channels rise abruptly due to a channel boosting effect and thus rise up to about 8V. At this time, in the case in which the threshold voltage of a neighboring memory cell, that is, the sixth memory cell MC5 is programmed about 1V, the sixth memory cell MC5 is turned off due to a potential between a channel voltage and the voltage of a floating gate. In this case, boosting is not generated in the drain select line DSL direction starting with the sixth memory cell MC5, but is generated from the SSL direction to the fifth memory cell MC4, so that an overall boosting voltage is lowered. Accordingly, sufficient boosting is not generated, which is ineffective in program inhibition.

Thus, the following method is proposed.

Figure 5:
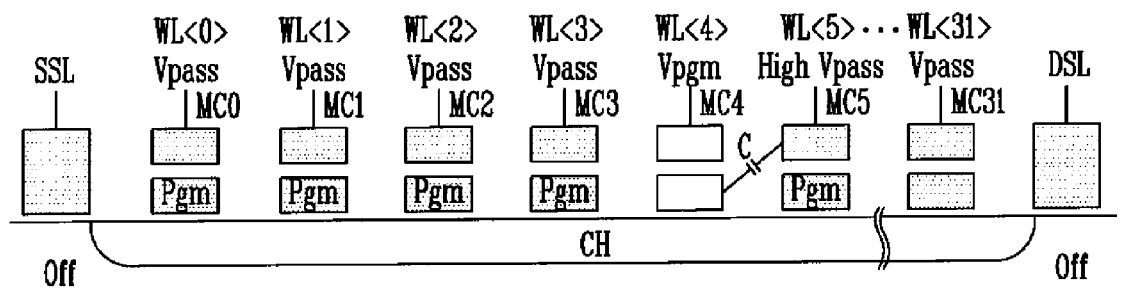
FIG. 5 is a view illustrating the application of voltages to word lines using a method of programming a non-volatile memory device in accordance with an embodiment of the present invention.

FIG. 5 is a view illustrating the application of voltages to the word lines using a method of programming a non-volatile memory device in accordance with an embodiment of the present invention.

Referring to FIG. 5, in a cell string including first through thirty-second word lines WL<0> through WL<31> between a source select line SSL and a drain select line DSL, respective word lines are connected to gates of first through thirty-second memory cells MC0 through MC31.

The first through fourth memory cells MC0 through MC3 and the sixth memory cell MC5 are programmed by a program operation and a memory cell to be programmed next is the fifth memory cell MC4.

Here, according to the above embodiment of the present invention, the fifth word line WL<4> selected for program is applied with a program voltage Vpgm. In the case in which a memory cell adjacent to the fifth word line WL<4> in the drain select line DSL direction is programmed, a high pass voltage High Vpass is applied to the word line of the corresponding memory cell.

That is, the first through fourth word lines WL<0> through WL<3> and the seventh through thirty-second word lines WL<6> through WL<31> are applied with the pass voltage Vpass, the fifth word line WL<4> is applied with the program voltage, and the sixth word line WL<5> is applied with the high pass voltage High Vpass. At this time, the high pass voltage High Vpass is lower than the program voltage Vpgm, but higher than the pass voltage Vpass. The programmed sixth memory cell MC5 has a voltage level to the extent that the sixth memory cell MC5 is not turned off during the channel boosting operation.

When the voltages are applied to the word lines as described above, channels are normally formed between the source select line SSL and the drain select line DSL, so that channel boosting can be generated effectively. Further, the program speed can be improved by coupling C between the floating gate of the fifth memory cell MC4 and the control gate of the sixth memory cell MC5 due to the high pass voltage High Vpass applied to the gate of the sixth memory cell MC5.

Figure 6:
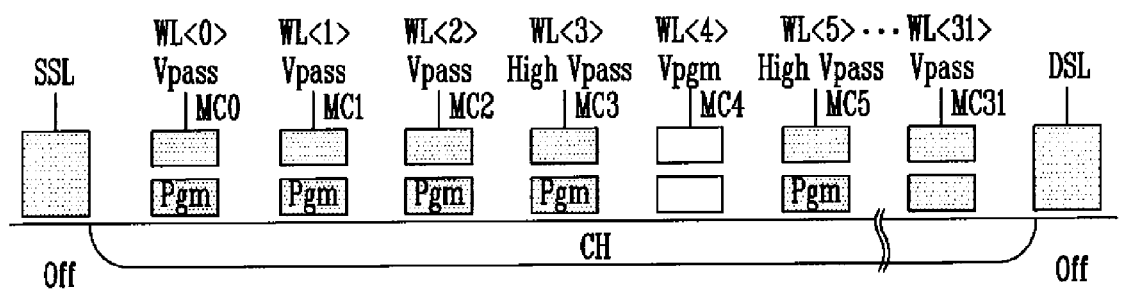
FIG. 6 is a view illustrating the application of voltages to word lines using a method of programming a non-volatile memory device in accordance with another embodiment of the present invention.

FIG. 6 is a view illustrating the application of voltages to the word lines using a method of programming a non-volatile memory device in accordance with another embodiment of the present invention.

Referring to FIG. 6, in a state where memory cells are programmed in the same manner as the cell string of FIG. 5, in the method of programming a non-volatile memory device, a fifth word line WL<4>, that is, a word line selected for program is applied with a program voltage Vpgm and fourth and sixth word lines WL<3> and WL<5> adjacent to the fifth word line WL<4> are applied with a high pass voltage High Vpass. Further, the remaining word lines are applied with a pass voltage Vpass.

Even when the voltages are applied to the word lines as described above, channels are normally formed, thus generating boosting. The effect of the increased program speed by the coupling as in the previous embodiment is also generated between the fourth memory cell MC3 and the fifth memory cell MC4.

Channel boosting of a program-inhibited cell string can be generated by applying the voltages to the word lines as described above.

Figure 7:
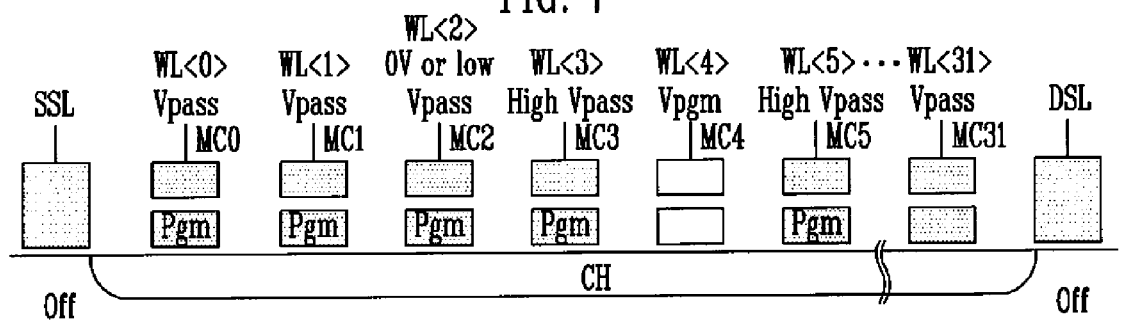
FIG. 7 is a view illustrating the application of voltages to word lines using a method of programming a non-volatile memory device in accordance with a third embodiment of the present invention.

FIG. 7 is a view illustrating the application of voltages to the word lines using a method of programming a non-volatile memory device in accordance with yet another embodiment of the present invention.

Referring to FIG. 7, in a state where memory cells are programmed in the same manner as the cell string of FIG. 5, in the method of programming a non-volatile memory device, a fifth word line WL<4> selected for program is applied with a program voltage Vpgm and fourth and sixth word lines WL<3> and WL<5> adjacent to the fifth word line WL<4> are applied with a high pass voltage High Vpass. Further, a third word line WL<2> adjacent to the fourth word line WL<3>, of the word lines located in the source select line SSL direction on the basis of the fifth word line WL<5>, is applied with a low pass voltage Low Vpass and the remaining word lines are applied with a pass voltage Vpass. The low pass voltage Low Vpass has a voltage level lower than that of the pass voltage Vpass.

In the case where the voltages are applied to the word lines according to the instant embodiment of the present invention, the degree of channel boosting can be maintained though charge sharing when channel boosting is generated excessively.

As described above, according to the method of programming of a non-volatile memory device in accordance with the embodiments of the present invention, even in a state where memory cells adjacent to a selected memory cell in a cell string that should be program-inhibited are in appropriately programmed, a channel boosting effect can be generated sufficiently and, therefore, effective program inhibition can be performed.

The embodiments disclosed herein have been proposed to allow a person skilled in the art to easily understand the present invention, and the person skilled in the part may implement the present invention by a combination of these embodiments. Therefore, the scope of the present invention is not limited by or to the embodiments as described above, and should be construed to be defined only by the appended claims.

What is claimed is:

1. A method of programming a non-volatile memory device, the method comprising the steps of:
   precharging an unselected bit line to which a cell string including memory cells is connected;
   applying a program voltage to a selected word line of the cell string;
   applying a first pass voltage to a first word line adjacent to the selected word line in a direction of a drain select line; and
   applying a second pass voltage to remaining word lines other than the selected word line and the first word line;
   thereby creating one boosting channel in the cell string.

2. A method of programming a non-volatile memory device, the method comprising:
   precharging an unselected bit line to which a cell string including memory cells is connected;
   applying a program voltage to a selected word line of the cell string;
   applying a first pass voltage to a first word line adjacent to the selected word line in a direction of a drain select line when a memory cell connected to the first word line is in program state or applying a second pass voltage to the first word line when the memory cell connected to the first word line is not in a program state; and
   applying the second pass voltage to remaining word lines other than the selected word line and first word line;
   thereby creating one boosting channel in the cell string.

3. The method of claim 2, wherein the first pass voltage is lower than the program voltage and higher than the second pass voltage.

4. The method of claim 2, wherein the applying of the program voltage includes turning off a source select transistor connected to a source select line.

5. A method of programming a non-volatile memory device, the method comprising the steps of:
   precharging a bit line to which a program-inhibited cell is connected;
   applying a program voltage, after precharging the bit line, to a first word line selected for programming; and
   applying a first pass voltage to each of a second word line and a third word line when memory cells connected to the second word line and the third word line, adjacent to the selected word line, are in a program state; and
   applying a second pass voltage to remaining word lines other than the first to third word lines.

6. The method of claim 5, further comprising, when the memory cell connected to the second or third word line is not to be programmed, applying the second pass voltage to the second or third word line connected to the memory cell not be programmed.

7. The method of claim 5, wherein the applying of the first pass voltage includes applying a voltage level, lower than that of the program voltage and higher than that of the second pass voltage.

8. The method of claim 5, further comprising turning off a source select transistor connected to a source select line.

9. A method of programming a non-volatile memory device, the method comprising the steps of:
   precharging a bit line to which a program-inhibited cell is connected; and
   applying a program voltage, after precharging the bit line, to a first word line selected for programming; and
   when a memory cell connected to a second word line adjacent to the selected word line in a direction of a drain select line and a memory cell connected to a third word line adjacent to the selected word line in a direction of a source select line are in a program state, the method includes:
   applying a first pass voltage to each of the second word line and the third word line;
   applying a third pass voltage to a fourth word line adjacent to the third word line in a direction of the drain select line; and
   applying a second pass voltage to remaining word lines other than the first to fourth word lines.

10. The method of claim 9, further comprising, when the memory cell connected to the second word line or the third word line is not to be programmed, applying the second pass voltage to the second word line or the third word line connected to the memory cell not to be programmed.

11. The method of claim 9, wherein:
   the first pass voltage has a voltage level lower than that of the program voltage and higher than that of the second pass voltage, and
   the third pass voltage has a voltage level lower than that of the second pass voltage.

12. The method of claim 9, further comprising:
   turning off a source select transistor connected to a source select line.

13. The method of claim 1, wherein the first pass voltage is lower than the program voltage and higher than the second pass voltage.

14. The method of claim 1, wherein the applying of the program voltage includes turning off a source select transistor connected to a source select line.

15. The method of claim 1, wherein the first pass voltage has a voltage level that does not turn off a memory cell connected to the first word lines during a channel boosting operation.

16. The method of claim 2, wherein the first pass voltage has a voltage level that does not turn off a memory cell connected to the first word lines during a channel boosting operation.

* * * * *